(12) United States Patent
Shanker et al.

(10) Patent No.: US 8,318,572 B1
(45) Date of Patent: Nov. 27, 2012

(54) INEXPENSIVE ELECTRODE MATERIALS TO FACILITATE RUTILE PHASE TITANIUM OXIDE

(75) Inventors: Sunil Shanker, Santa Clara, CA (US);
Xiangxin Rui, San Jose, CA (US);
Pragati Kumar, San Jose, CA (US);
Hanhong Chen, San Jose, CA (US);
Toshiyuki Hirota, Tokyo (JP)

(73) Assignee: Intermolecular, Inc., San Jose, CA (US)

( * ) Notice: Subject to any disclaimer, the term of this patent is extended or adjusted under 35 U.S.C. 154(b) by 363 days.

(21) Appl. No.: 12/708,872

(22) Filed: Feb. 19, 2010

(51) Int. Cl.
*H01L 21/20* (2006.01)
*H01L 21/8242* (2006.01)
*H01L 21/8234* (2006.01)
*H01L 21/8244* (2006.01)
*H01L 21/3205* (2006.01)

(52) U.S. Cl. ...... 438/381; 438/240; 438/238; 438/585; 438/591

(58) Field of Classification Search ............... 438/591, 438/585, 396, 240, 3, 253, 239, 244, 250, 438/393, 381, 387, 761, 532, 238
See application file for complete search history.

(56) References Cited

U.S. PATENT DOCUMENTS

2006/0118879 A1* 6/2006 Li .................... 257/369
* cited by examiner

*Primary Examiner* — Chuong A. Luu

(57) ABSTRACT

This disclosure provides a method of fabricating a semiconductor stack and associated device, such as a capacitor and DRAM cell. In particular, a bottom electrode has a material selected for lattice matching characteristics. This material may be created from a relatively inexpensive metal oxide which is processed to adopt a conductive, but difficult-to-produce oxide state, with specific crystalline form; to provide one example, specific materials are disclosed that are compatible with the growth of rutile phase titanium dioxide ($TiO_2$) for use as a dielectric, thereby leading to predictable and reproducible higher dielectric constant and lower effective oxide thickness and, thus, greater part density at lower cost.

26 Claims, 8 Drawing Sheets

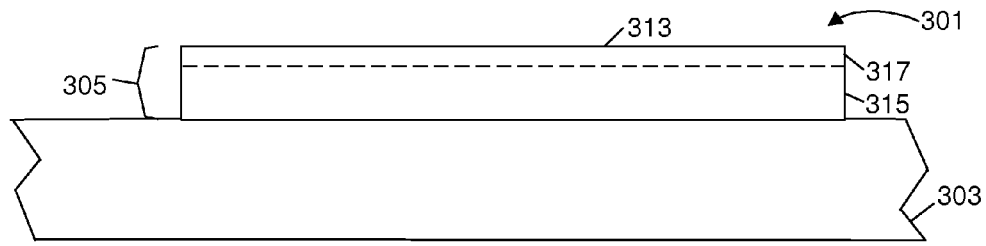
FIG. 3b
FIG. 3c
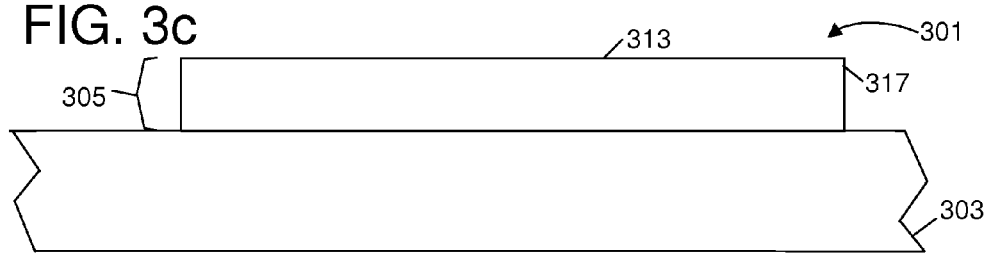
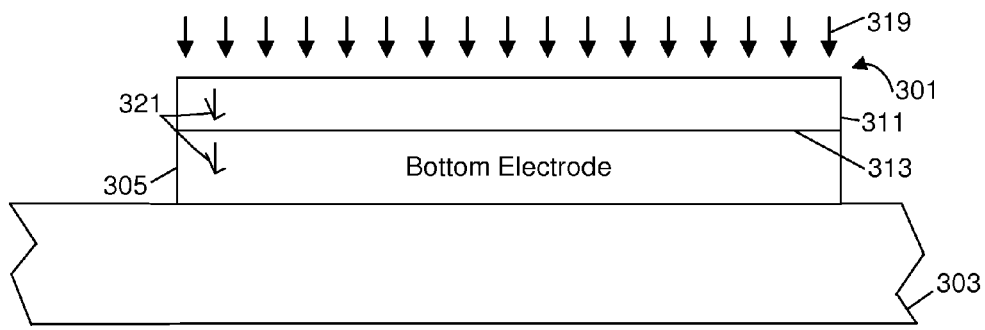
FIG. 3d
FIG. 3e
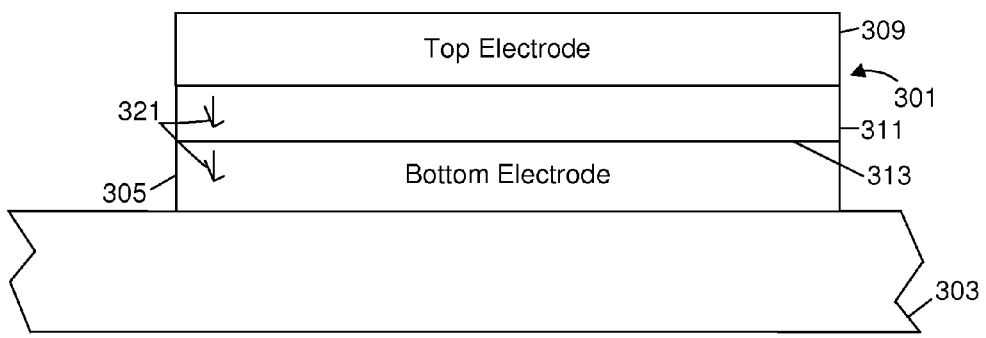

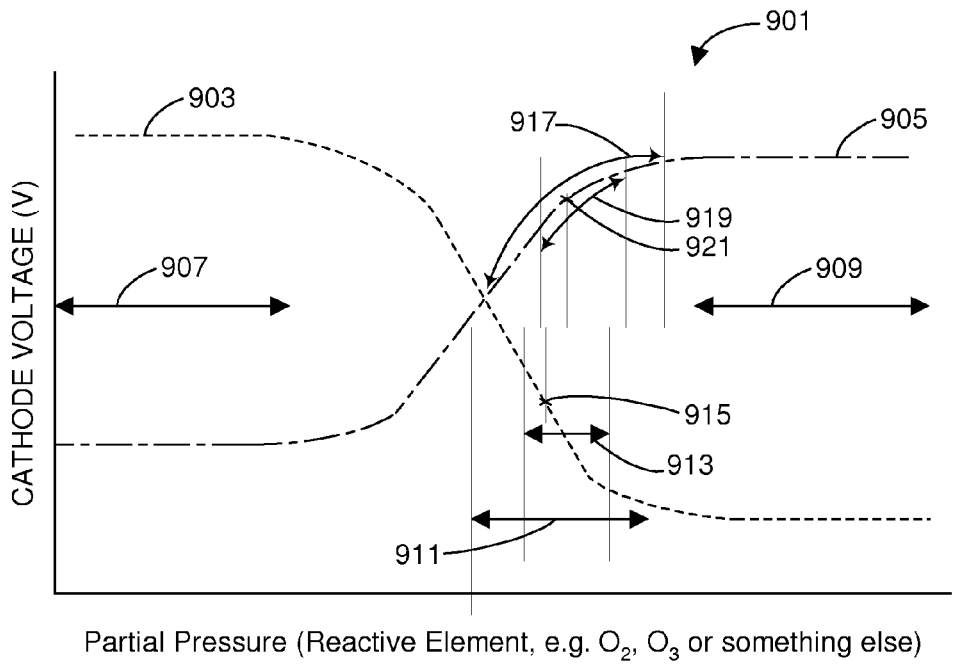
FIG. 9
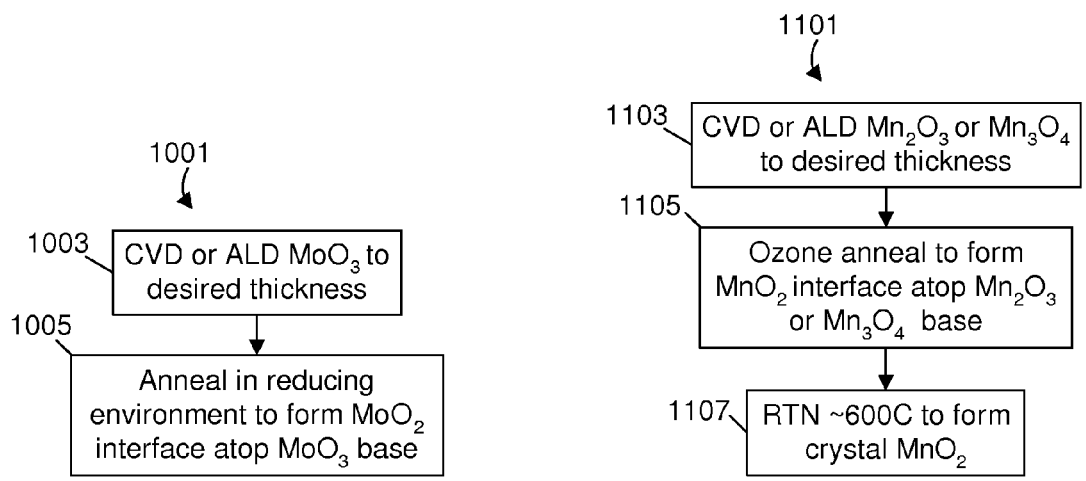
FIG. 10
FIG. 11

INEXPENSIVE ELECTRODE MATERIALS TO FACILITATE RUTILE PHASE TITANIUM OXIDE

This document relates to the subject matter of a joint research agreement between Intermolecular, Inc. and Elpida Memory, Inc, and also relates to co-pending application Ser. No. 12/708,848, for "Inexpensive Electrode Materials To Facilitate Rutile Phase Titanium Oxide," filed on behalf of inventors Sunil Shanker et al. on Feb. 19, 2010. The inventions set forth in this document as well as the referenced application where made by or on the behalf of parties to the aforementioned joint research agreement, within the meaning of 35 U.S.C. 103(c)(3) and paragraph (c)(4)(ii) of 37 C.F.R. 1.104; said joint research agreement was in effect on or before the date the claimed invention was made, and the claimed invention was made as a result of activities undertaken within the scope of said joint research agreement.

This disclosure relates to the ability to produce materials with high dielectric constant, including without limitation, capacitors and structures based on capacitors, such as dynamic random access memory ("DRAM") cells.

BACKGROUND

The obtainable density of DRAM and other semiconductor devices is strongly tied to the ability to miniaturize their component structures, among them capacitors. In turn, thinner and smaller area capacitors are obtained using high dielectric constant materials. Certain metal oxides show promising application as these high dielectric constant materials, but these metal oxides can vary greatly in terms of obtainable and reproducible dielectric constant.

Titanium dioxide ($TiO_2$) is one such oxide. Titanium oxide can be produced in an amorphous form, but also has anatase and rutile crystalline phases. The anatase phase has a dielectric constant on the order of forty, whereas the rutile phase can have a dielectric constant ranging from eighty to one-hundred-seventy, more than twice than that of anatase A need therefore exists for ways to produce specific forms of metal oxides; ideally, such methods could be inexpensively implemented in a manufacturing context; this would lead to consistently higher dielectric constant and therefore greater, reproducible device density. The present invention addresses these needs and provides further, related advantages.

DETAILED DESCRIPTION

FIG. 1 is an illustrative diagram that shows a metal-insulator-metal ("MIM") stack 101, configured as a capacitor. The depicted stack includes a bottom electrode 103, a metal oxide layer 105 and a top electrode 107. The stack 101 uses a specific layer 111 as a part of, or all of, the conductor 103, in effect forming an interface layer to help promote better dielectric constant (and related to this concept, better effective oxide thickness or "EOT"). If desired, the bottom electrode 103 may also include a relatively inexpensive base layer 113 such as titanium nitride (TiN) and the interface layer 111 may be configured as a relatively thin "capping layer" or "flash layer," to promote specific surface characteristics; whether the interface layer 111 forms all of the electrode or just a top surface, it is chosen to have specific characteristics that enhance the likelihood of obtaining a specific form of metal oxide for the metal oxide layer 105.

FIG. 2 presents an overview 201 of several different embodiments associated with the MIM stack of FIG. 1. In particular, a first embodiment 203 is obtained using one or more specific materials in the interface layer 111 from FIG. 1 in concert with a titanium dioxide ($TiO_2$) dielectric layer. A second embodiment 205 is obtained using a metal oxide dielectric layer, and an electrode "interface" layer having a lattice structure consistent with rutile phase $TiO_2$, a work function of at least 4.8 eV, and a Gibbs free energy of at most −400 kiloJoules (kJ) per mole. A third embodiment 207 is obtained using a titanium oxide dielectric $TiO_x$ (e.g., $TiO_2$) and in situ processing of a material to become an electrode material having a suitable lattice structure (this processing can be performed before the dielectric is created, e.g., to process a material to have an interface layer that is operable as part of or all of an electrode). As with other FIGS. in this disclosure, the use of dashed lines indicates optional processes that can be employed to obtain still more specific embodiments.

FIGS. 3a-3e illustrate steps of forming a capacitive structure, such as the structure seen in FIG. 1. In FIGS. 3a-3e, like numbers represent like elements.

FIG. 3a introduces fabrication of a bottom electrode 305 on a substrate 303; the bottom electrode, or "BEL" precedes the formation of other device layers (collectively represented by numeral 307).

FIG. 3b shows that the bottom electrode 305 is fabricated to have at least a layer 317 that will provide a suitable interface 313 for a dielectric layer (not seen in FIG. 3). Underneath the interface layer 317, a base layer 315 can be made from inexpensive conductive or non-conductive materials, depending on desired device properties.

FIG. 3c is similar to FIG. 3b, except the bottom electrode 305 is fabricated to consist entirely of interface layer 317.

FIG. 3d shows a dielectric layer 311 atop the electrode surface 313. As indicated by a set of downward-facing arrows, 319, the dielectric layer 311 can be "grown" atop the interface or surface 313, for example, via chemical vapor deposition ("CVD"), physical vapor deposition ("PVD"), atomic layer deposition ("ALD") evaporative, or other processes. As indicated by matching lattice symbols 321, the layer 317 is specifically chosen or fabricated such that the interface will engender the formation of the desired metal oxide form; for example, the interface 313 can be chosen to have a lattice structure compatible with rutile phase $TiO_2$, to thereby promote the grown of rutile phase $TiO_2$ over other forms of $TiO_2$.

FIG. 3e shows the addition of a top electrode 309 over the dielectric layer, to complete the formation of a capacitive structure.

FIG. 4 shows methodology for fabricating the structure seen in FIG. 3e. In particular, three branches, represented by processes 411, 413 and 417, represent alternatives for producing a completed device. As represented by a process 427, an anneal completes this methodology, irrespective of branch, to produce a finished capacitive device.

Figure 8:
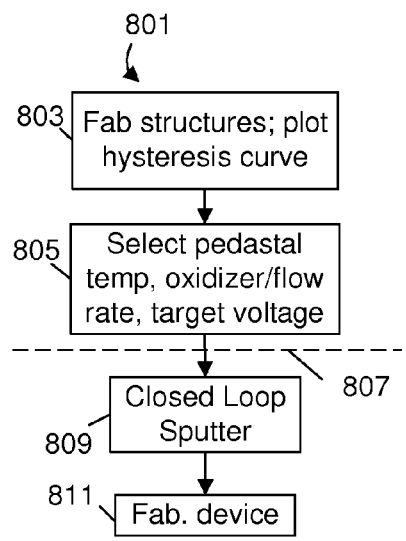

FIG. 8 illustrates a process of identifying suitable deposition parameters for a closed-loop PVD process, that is, one that relies on specifically controlled deposition parameters used to obtain difficult-to-produce oxidation states and associated crystalline structures. Once a hysteresis curve is plotted and associated deposition parameters identified, per processes 803 and 805, a fabrication process can be implemented on a reproducible basis.

FIG. 9 shows an exemplary hysteresis curve. Generally, depending on materials and process parameters, the hysteresis curve may be either upward sloping or downward sloping, with deposition rate represented by the horizontal axis and poison mode represented by a region 909.

FIG. 10 shows a process of obtaining a suitable electrode interface, first by depositing molybdenum trioxide ($MoO_3$) and then by in situ modifying a surface of this material (via a reducing anneal) to both become a conductor ($MoO_2$) and to have a lattice structure compatible with rutile phase $TiO_2$.

FIG. 11 shows a process of obtaining a suitable electrode interface based on manganese dioxide $MnO_2$, where $Mn_2O_3$ or $Mn_3O_4$ is first deposited by ALD or CVD, and where a surface or interface layer is then created in situ by an oxygenating anneal to become $MnO_2$, again, to have a lattice structure compatible with $TiO_2$.

Figure 12:
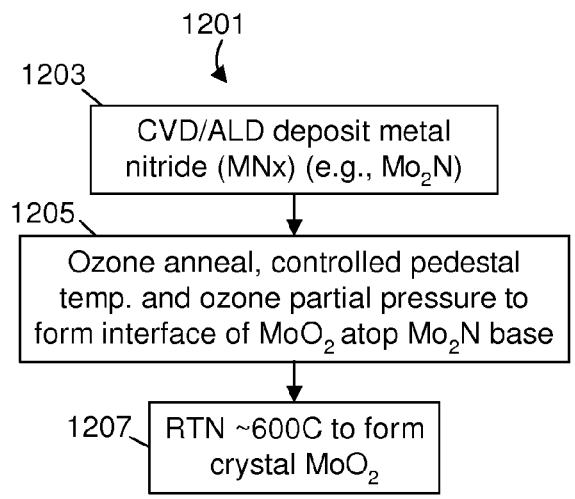

FIG. 12 shows a process where a metal nitride "MNx" (e.g., $Mo_2N$) is first deposited by ALD or CVD, and where a surface or interface is then in situ modified by an oxygenating anneal to become $MoO_2$, again, to have a lattice structure compatible with $TiO_2$. An advantage presented by this process embodiment is that the metal nitride MNx represents an inexpensive electrode material, such that a base electrode may be inexpensively formed and then processed using standard semiconductor fabrication equipment to be compatible with, and to help grow, a metal oxide of a specific form; for example, the embodiment of FIG. 12 may be used to help grow rutile phase $TiO_2$.

Figure 13:
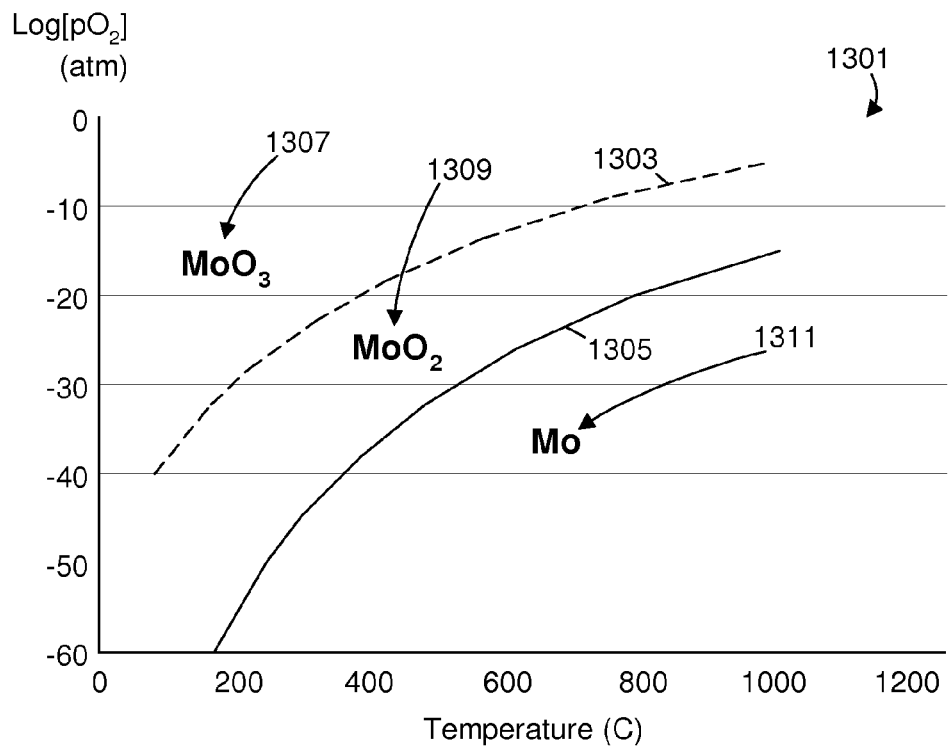

FIG. 13 shows a graph 1301 having two curves, 1303 and 1305, which respectively indicate process boundaries associated with the use of $MoO_2$; in particular, a dashed-line curve 1303 represents a transition differentiating the formation of $MoO_3$ and $MoO_2$, and a solid curve 1305 represents a transition differentiating the formation of $MoO_2$ and metal molybdenum (Mo). As indicated by FIG. 13, appropriate selection of process temperature and oxygen rate, when combined with appropriate process materials, may be used to fabricate a specific metal oxide, for example, molybdenum dioxide ($MoO_2$), tungsten dioxide ($WO_2$), chromium dioxide ($CrO_2$), manganese dioxide ($MnO_2$), iron dioxide ($FeO_2$), tin dioxide ($SnO_2$), cobalt dioxide ($CoO_2$) or nickel dioxide ($NiO_2$).

Figure 14:
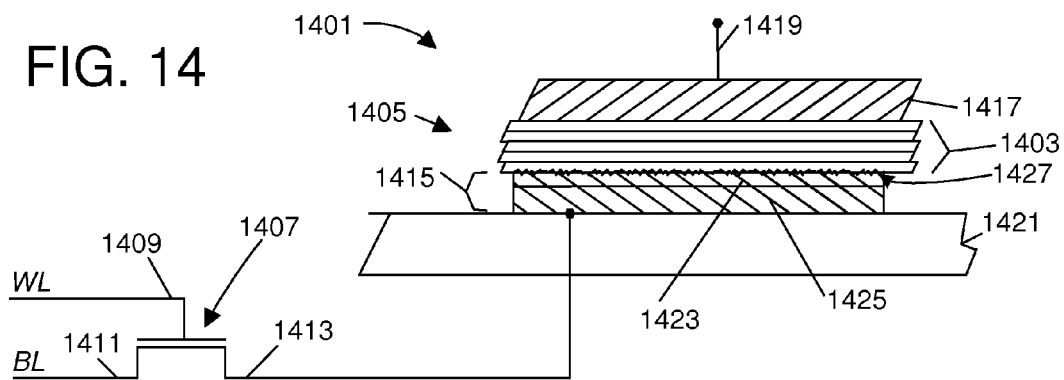

FIG. 14 is a diagram used to illustrate fabrication of a dynamic random access memory ("DRAM") cell according to the principles introduced herein.

Figure 15:
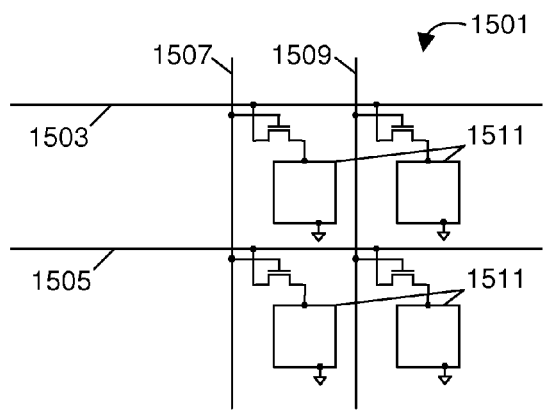

FIG. 15 shows an array of DRAM cells, made according to the technology presented herein.

Figure 16:
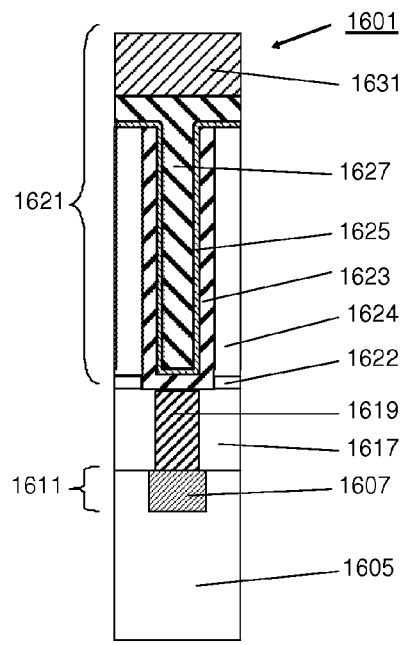
Figure 17:
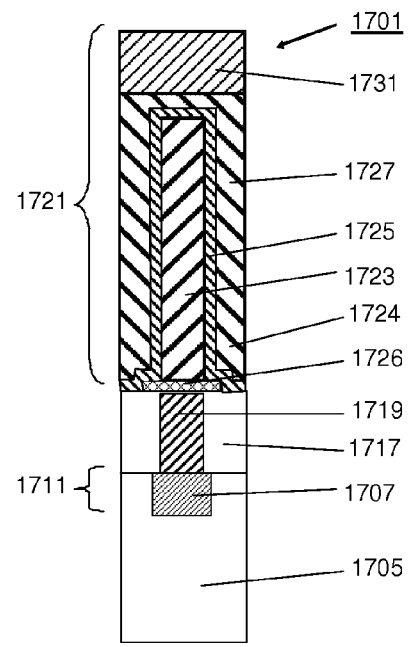
Figure 18:
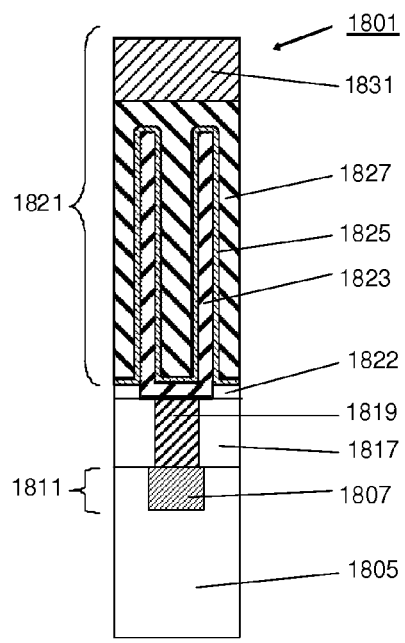

FIGS. 16-18 respectively illustrate memory cells including different capacitor configurations.

FIG. 16, in particular, illustrates a memory cell 1601 including a cylinder-shaped capacitor 1621.

FIG. 17 illustrates a memory cell 1701 using a pillar- or pedestal-shaped capacitor 1721.

FIG. 18 illustrates a memory cell 1801 using a crown-shaped capacitor 1821.

DETAILED DESCRIPTION

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of forming at least part of an electronic device stack, namely, one having a dielectric layer and a conductive layer or layers operative as an electrode, and (ii) a semiconductor stack, for example, employed as a capacitor, a DRAM cell, or similar device. The invention, however, may also be applied to other examples as well.

I. Introduction

This disclosure provides a semiconductor stack or assembly conducive to the growth of specific material, such as a dielectric. In some embodiments presented below, this is addressed through by using relatively inexpensive electrode materials which are processed during deposition or in situ to have lattice matching characteristics compatible with the desired specific dielectric. More specifically, not only can a metal oxide be used as dielectric, but relatively specific, conductive metal oxide forms can be deposited for use as the electrode (or a surface layer of the electrode) or processed in situ to become conductive. In specific embodiments presented below, the desired dielectric can be based primarily on a titanium oxide material (TiOx) with a conductor interface provided by a primary constituent selected from a specific group of materials (e.g., molybdenum dioxide ($MoO_2$), tungsten dioxide ($WO_2$), chromium dioxide ($CrO_2$), manganese dioxide ($MnO_2$), or tin dioxide ($SnO_2$)); iron dioxide ($FeO_2$), cobalt dioxide ($CoO_2$) and nickel dioxide ($NiO_2$), may also prove suitable for use in this context. In other embodiments, the dielectric can be any desired material and the conductor interface can be provided by first depositing a material having a first, thermodynamically-favored state and, then, in situ processing at least a surface of the material to adopt a different state, such that it can be used as to grow a desired dielectric. Other applications will also be clear from the description below.

As alluded to, different crystalline forms of $TiO_2$ can provide for different effective dielectric constant. Recent attention has been given to the use of a specific lattice structure upon which to grow a specific metal oxide form. For example, co-pending application PCT/US09/57371 for Fabrication Of Semiconductor Stacks With Ruthenium-Based Materials, assigned in common with this disclosure, presents structures where rutile phase titanium dioxide ($TiO_2$) can be grown atop ruthenium dioxide; this co-pending application is hereby incorporated by reference. Unfortunately, ruthenium-based materials (as well as source material other "Noble" metals) tend to be quite costly, as may be cost-prohibitive as a scalable process used in large volume products, such as DRAM devices; as further mentioned in the co-pending application, the use of ruthenium can also cause nucleation delay, which further detracts from the scalability of ruthenium-based solutions.

This disclosure therefore provides alternative materials suitable for use in lattice matching growth of dielectric materials. In the embodiments presented below, a dielectric formed principally of rutile phase $TiO_2$ will be the focus; as mentioned, rutile phase $TiO_2$ can provide excellent dielectric constant, generally of at least 80 and in some cases up to 170. The principles of this disclosure can, however, be extended to nearly any desired material (that is to say, other materials including other metal oxide forms providing suitable dielectric properties will no doubt gain popularity and acceptance).

Thus, while many embodiments are couched in terms of using TiOx as a dielectric, it should be understood that the principles provided below are not so limited.

Figure 1:
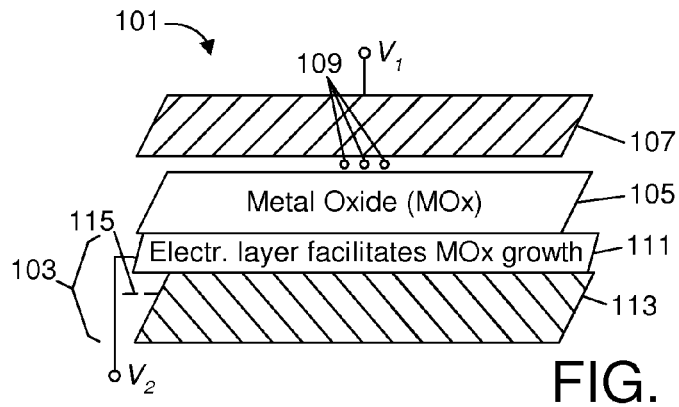

FIG. 1 presents a semiconductor assembly 101 having at least one electrode (a bottom electrode 103) and a dielectric 105. While the assembly can be applied to a variety of uses, in this example, the assembly is further configured as a capacitor, meaning that it also has a top electrode 107 with the two electrodes being controlled so as to store a charge between them, represented by the notations indicating a different voltage ($V_1$ or $V_2$) for each electrode. As represented by the use of ellipses 109, the assembly may additionally include other layers, depending on desired application, such as smoothing layers, adherence layers, current steering layers, or other mechanisms, layered between the top electrode 107 and the dielectric 105, or potentially between other pairs of layers. The bottom electrode 103 can be mounted on a silicon-based substrate (not shown in FIG. 1). Preferably, the bottom electrode includes a layer of material 111 selected to provide an interface for the dielectric material. That is to say, the layer of material 111 can be selected to encourage the growth of a desired metal oxide (MOx) form, for example, using lattice matching principles. The bottom electrode 103 can be entirely composed of this layer of material 111 or, if desired, the bottom electrode can further include a base layer 113 that can be a conductive material in some embodiments. For example, if a conductive base layer is used, the base layer can be made of a relatively inexpensive material (e.g., a metal nitride) and a bitline or other conductor can be connected to (or form a continuous portion of) this base layer 113 instead of the layer of material 111, as denoted by dashed line connector 115. Thus, if desired, the layer of material 111 can be made to be a "flash" or "capping" layer.

In one embodiment, the interface layer 111 can be made relatively thin (e.g., less than fifty Angstroms in thickness) with the inexpensive "base layer" being at least this thick (such that the layer of material 111 makes up less than fifty percent of overall electrode thickness); in yet another embodiment, a base layer may be made several times thicker than layer of material 111 (such that the base layer makes up eighty percent or more of overall electrode thickness).

Irrespective of whether an inexpensive base layer is used in the electrode, the electrode provides an exposed conductor surface suitable for the growth of a desired dielectric form. Where a layer of titanium oxide is grown above this surface (e.g., using an ALD process), lattice matching provided by interface with the electrode promotes the growth of rutile-phase titanium oxide, which has high and desirable dielectric constant. Electrode materials can be used that have a very high work function material, and, thus, lower leakage, thereby promoting effective use of these materials as capacitors. The use of these materials therefore promotes high device density, and thereby facilitates the trend toward increased miniaturization alluded to earlier.

Figure 2:
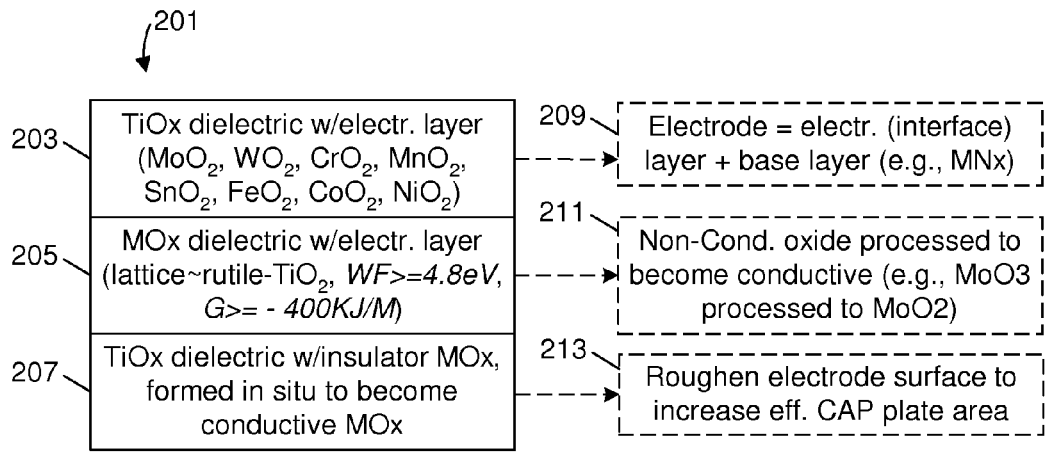

FIG. 2 helps provide further detail on methods for building a semiconductor assembly, such as the MIM stack seen in FIG. 1. A diagram 201 indicates three embodiments, respectively numbered 203, 205 and 207. In a first embodiment 203, the assembly can include a TiOx dielectric, where one or more specific materials are used as the primary constituent of an electrode interface, for example, a constituent selected from the group of molybdenum dioxide ($MoO_2$), tungsten dioxide ($WO_2$), chromium dioxide ($CrO_2$), manganese dioxide ($MnO_2$), or tin dioxide ($SnO_2$). Each of these latter materials, it is believed, has forms with specific lattice matching characteristics that should help grow a TiOx layer having improved dielectric properties. Although untested, it is also believed that iron dioxide ($FeO_2$), tin dioxide ($SnO_2$), cobalt dioxide ($CoO_2$) and nickel dioxide ($NiO_2$) may also constitute suitable members of this group. In a second embodiment 205, a MIM stack is fabricated using $TiO_2$ and an electrode material to provide an interface for the $TiO_2$ where the electrode material satisfies specific constraints, that is, has a work function greater than 4.8 eV, a Gibbs free energy of at most −400 kilojoules per mole (kJ/mole), and lattice compatibility with $TiO_2$. [What this latter condition means is that the Gibbs free energy, ΔG, should be more negative than −400 kJ/mole, i.e., $\Delta G \leq -400$ kJ/mole.] More will be stated below about how lattice compatibility is determined. A metal oxide (MOx) dielectric, such as TiOx, can be used in a third embodiment, 207, with an electrode material that is processed in situ to adopt a suitable lattice matching characteristics and, thus, provide a suitable electrode interface for a MOx dielectric; such a process for example, can be used where it is difficult to deposit the specifically desired electrode materials using conventional processes. FIG. 2 also illustrates a number of other options (denoted using dashed lines), including a first option 209 where the electrode can include both an interface layer and a base layer, and a second option 211, where an electrode interface is fabricated using a material that is initially nonconductive (e.g., is deposited in a thermodynamically favored form that is not suitable for use as the electrode interface, such as an insulator) but that is processed in situ to become conductive in addition to providing appropriate lattice matching characteristics; for example, molybdenum trioxide ($MoO_3$) can be deposited as an insulator and via in situ processing, a $MoO_2$ surface can be formed in the $MoO_3$ and then crystallized so as to have desired "interface layer" lattice properties. In yet other another variation 213, the interface may be deliberately "roughened" to increase electrode surface area by introducing deformities, so as to effectively increase effective capacitance. That is to say, an exposed electrode surface may be subjected to a surface treatment process that effectively scratches (i.e., roughens) the exposed material so as to increase its effective surface area. By increasing the effective surface area of a relatively thin metal layer (e.g., a ruthenium-based capping layer), capacitor plate surface area may be increased without using processes to create hemispherical polysilicon or related etch processes. See, e.g., U.S. Pat. No. 6,794,245 to Zheng. These and other options will be further discussed below.

Notably, the term "MIM" as used herein should be understood to encompass any combination of layers that utilize a dielectric with two electrodes, whether or not additional layers are present; for example, the term "MIM" should be understood to encompass metal-insulator-insulator-metal, metal-insulator-insulator-insulator-metal, metal-insulator-metal-insulator-metal and other, similar structures, with or without further insulators, enhancement layers, smoothing or adherence layers or other structures between them. An oxide "layer" (whether used in the context of part or all of an electrode or the dielectric) should be understood to refer to either (a) an entire layer, which may consist of a single layer or one or more "monolayers" that together cooperate to form an oxide layer, as well as (b) individual monolayers layers, e.g., an oxide of titanium, yttrium/aluminum, or both. Thus, a "layer" may refer to a single layer, to an aggregate combination of layers, or to one monolayer. The term "nanolayer" refers to a thin deposition that may achieve sparse or complete layer coverage—for example, a single ALD cycle may be used to deposit a nanolayer. The "substrate" may be any material capable of supporting a layer of semiconductor material, and may include a metal conductor, insulator, glass, previously deposited layer (dielectric, or otherwise) or another material, but generally in this disclosure will refer to a metal electrode mounted above a SiO$_2$ or other base. "Preparation," "treatment" or "pretreatment" of a layer typically includes cleaning or oxidizing a substrate to promote good adhesion between a to-be-deposited layer and the substrate, and to otherwise ready the substrate's surface for a semiconductor deposition; in the context of the discussion below, this term is also used to encompass scrubbing under pressure to render the surface somewhat abrasive, i.e., to scratch or roughen the surface. It should also generally be noted that when the term "ozone" is used in this disclosure, it is being used not to necessarily require "pure, 100%" ozone—that is, generally speaking, ozone is typically not used in pure form, i.e., it is typically mixed with other gasses such as oxygen in an approximately ⅕ ratio, and that such a mixture is typically the instantiation of "ozone" in the specific processes advanced by this disclosure.

Figure 3A:
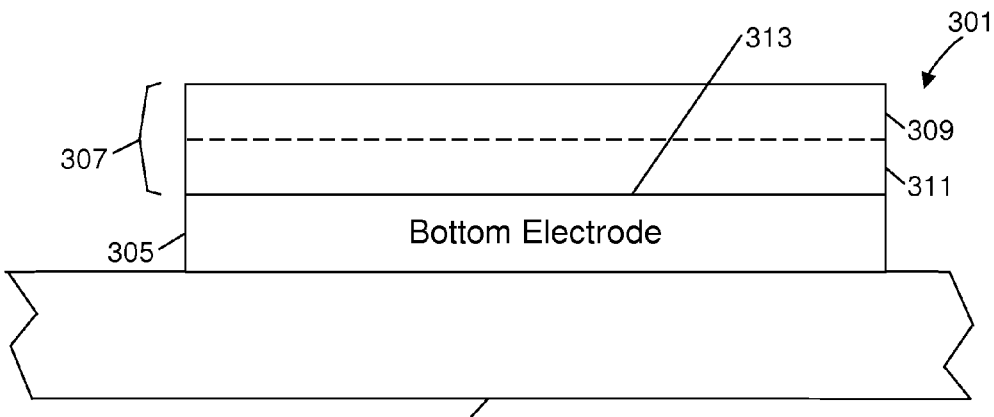

FIGS. 3a-3e present views illustrating the fabrication of different layers of the device of FIG. 1. In particular, FIG. 3a shows a basic MIM stack assembly 301 having a substrate 303, a bottom electrode or "BEL" 305, and a number of additional layers 307, typically including a top electrode "TEL" 309 and one or more layers of dielectric material 311. In accordance with the techniques mentioned above, the BEL has a top surface 313 that provides an interface for the dielectric materials, to provide for preferred growth and development of specific metal oxide forms for use as the dielectric. In one example, the dielectric can have a primary constituent of rutile phase TiO$_2$ as previously mentioned, and the BEL can have at least a top surface formed from a specific, relatively inexpensive material such as molybdenum dioxide (MoO$_2$), tungsten dioxide (WO$_2$), chromium dioxide (CrO$_2$), manganese dioxide (MnO$_2$), or tin dioxide (SnO$_2$). Depending on the specific crystalline form desired for the dielectric, nearly any electrode material can be used having (or formable to have) a crystalline structure compatible with (i.e., that engenders growth of) the desired dielectric form (i.e., rutile phase TiO$_2$), depending on fabrication parameters such as cost, deposition rate, optimal dielectric constant and leakage, and other factors.

To elaborate on the issue of crystalline compatibility, rutile phase TiO$_2$ has lattice parameters of approximately 4.5933, 4.5933 and 2.9592 Å ("a," "b" and "c," which are standard angle-based measures, derived from "Bragg's Law," used to express crystalline shape). Conventionally, another crystalline form would be "compatible" with this structure if its "a," "b" and "c" measurements were each within five percent of the corresponding "a," "b" and "c" parameters of rutile phase TiO$_2$; as used in this disclosure, however (unless otherwise specifically indicated), "compatibility" should be understood to mean within about ten percent of the structure's numbers. For example, for TiO$_2$, "compatible" as used by this disclosure would mean that the interface for a material supporting the dielectric (e.g., the electrode) would have a crystal structure (1) with an "a" value of between 4.14497 and 5.05263 Å, (2) with a "b" value of between 4.14497 and 5.05263 Å, and (3) with a "c" value of between 2.66328 and 3.25512 A. Again, these values represent the range of 90%-110% the crystal parameter values for TiO$_2$, and they would be different if another dielectric material was instead used or if it was desired to promote growth of some other material. For some of the materials mentioned above, the lattice crystal parameters are as set forth in Table 1, below.

TABLE 1

| Material | Lattice constants (Å) | | |
| --- | --- | --- | --- |
|  | a | b | c |
| Rutile TiO2 | 4.59 | 4.59 | 2.96 |
| WO2 | 4.86 | 4.86 | 2.77 |
| MoO2 | 4.86 | 4.86 | 2.81 |
| CrO2 | 4.42 | 4.42 | 2.92 |
| SnO2 | 4.74 | 4.74 | 3.19 |
| ReO2 | 4.79 | 4.79 | 2.81 |
| MnO2 | 4.40 | 4.40 | 2.88 |

Having a lattice constant within ten percent of the corresponding value for rutile phase TiO$_2$ does not on its own guarantee suitability of a material for growth of a desired metal oxide form, nor does the above-stated lattice compatibility criteria mean that other materials are not suitable; rather, the "compatibility" merely is one criteria for selecting possibly suitable materials.

Another criterion used to select suitable materials can include the relative stability of the material for the fabrication processes used, related to the material's Gibbs Free Energy ($\Delta G$). Generally speaking, the more negative the $\Delta G$ value for a material, the more stable it will be and the more suitable for semiconductor manufacturing processes. For some of the materials including many of those mentioned above, the $\Delta G$ value is given in Table 2, below.

TABLE 2

| Material | $\Delta G_f$ (kJ/mole) |
| --- | --- |
| Rutile TiO2 | −888 |
| WO2 | −530 |
| MoO2 | −528 |
| CrO2 | −544 |
| SnO2 | −475 |
| ReO2 | −378 |
| MnO2 | −465 |
| OsO2 | −238 |
| RuO2 | −253 |
| IrO2 | −161 |
| RhO2 | −205 |
| PtO2 | −164 |

Not all of these materials may be desirable; for example, as alluded to earlier, it is generally desired to use materials that are low cost; noble metal oxides, such as RuO$_2$ and PtO$_2$ tend to be expensive, and thus may not be desirable as a method of producing low-cost devices. Also of note, generally speaking, it is believed that a $\Delta G$ of at most −400 kJ/mole is desired for materials that are to serve as the growth surface for rutile phase TiO$_2$ (again, "at most" as used in this context means having an energy that is equal to or more negative than −400 kJ/mole, i.e., −500 kJ/mole would satisfy this criterion, whereas −300 kJ/mole would not). For example, rhenium dioxide (ReO$_2$) generally satisfies the lattice criteria articulated above, but not the $\Delta G$ criterion just mentioned.

A high work function is also a desired parameter, for growth surfaces that are also to serve as an electrode material. In this regard, leakage in the context of a capacitor is directly related to the ability of a capacitor to store charge; for many structures, including DRAM cells, a leakage as close to zero as possible is desired as this maximizes the ability of DRAM cells to store charge over longer duration and relaxes refresh requirements. Noble metals, such as platinum and ruthenium, generally provide very high work function, on the order of 4.8 eV or higher, but these source materials for these metals as mentioned are also generally expensive. Where a specific metal oxide form is to be used as a dielectric, in contact or close proximity to a conductor, it would be desirable to also have the associated interface material have a work function of about 4.8 eV or higher. Table 3, below, lists work function for some of the materials identified above.

TABLE 3

| Material | WF |
|---|---|
| WO2 | 4.8 eV |
| MoO2 | 4.8 eV |
| CrO2 | 4.9 eV |
| SnO2 | 4.6 eV |
| MnO2 | 5.0 eV |

With reference back to FIG. 3a, the interface 313 is preferably selected based on application, i.e., in this example, to be a conductor upon which a metal oxide dielectric (rutile phase $TiO_2$) can be grown. As will be explained further below, a variety of processes can be used to deposit the various materials and their associated MIM stack layers, including physical vapor deposition ("PVD"), chemical vapor deposition ("CVD"), atomic layer deposition ("ALD"), evaporative or other processes. For purposes of discussion of FIGS. 3a-3e, it is assumed that an ALD process is used.

FIG. 3b presents a view of the structure 301 of FIG. 3a, but where only the BEL 305 has been deposited atop a substrate 303. In this example, the BEL 305 consists of two layers, including a base layer 315 and an interface layer 317. The interface layer represents that material that encourages growth of the desired metal oxide form, e.g., that material having lattice structure, Gibbs free energy and so forth, that engenders the formation of rutile phase $TiO_2$, whether the layer 317 is deposited with these properties, or represents a portion of BEL 305 that is modified in situ to have the desired properties. As mentioned, the base layer 315 can be conductive in one embodiment and non-conductive in another. In capacitor or DRAM cell applications, it may be desired to have the base layer 315 consist of a relatively cheap, easily fabricated, highly conductive material, for example, titanium nitride (TiN), with the interface layer 317 added on top. Alternatively, the interface layer can be formed in situ from the base layer—for example, in one embodiment, $Mo_2N$ can be deposited as the base layer 315, with a top region formed by controlled oxygen treatment to replace the nitrogen atoms with oxygen atoms and convert a thin surface layer of the $Mo_2N$ to $MoO_2$, and thus form the interface layer in situ. In yet another embodiment, the base layer can be made non-conductive—for example, a relatively thick layer of $MoO_3$ (an insulator) can be deposited as the base layer 315, with the interface layer processed by reducing this material to form conductive $MoO_2$ as the interface layer 317. Generally speaking, if a base layer 315 is used as part of the electrode, or to support a conductive interface layer 317 for an electrode, the base layer typically makes up at least 50% of overall electrode thickness; in one embodiment, the base layer can make up 80% or more of the overall electrode thickness, meaning that the base layer can be at least four times as thick as the interface layer. The interface layer can be on the order of 5-50 Angstroms thick. Irrespective of specific process, the BEL 305 is formed to have a surface or other suitable interface 313 upon which to grow the desired material.

FIG. 3c provides a view similar to that of FIG. 3b, but in which there is no base layer. That is to say, FIG. 3c shows the structure 301 having the BEL 305 deposited atop the substrate 303, but where the electrode consists entirely of the interface layer 317. To provide an example, several deposition processes are described below including one where $MoO_2$ is originally fabricated on the substrate and then crystallized to have the desired properties as a growth medium for rutile phase $TiO_2$. Whichever material is used, once again, the desired growth surface 313 is presented to whichever material is to be deposited atop the BEL, so as to engender formation of the desired metal oxide form (or other material form, depending on application).

FIG. 3d provides a view which shows the deposition of the dielectric atop the BEL 305. In particular, the structure 301 is now seen to consist of the substrate 303 (e.g., a silicon substrate or other support medium), the BEL 305 and the dielectric 311. If produced by an ALD process, the dielectric 311 may include a number of nanolayers or other depositions which after many cycles, builds a dielectric of suitable thickness. For this example, it should be assumed that a dielectric of rutile phase $TiO_2$ is created, of approximately 50-80 Angstroms thickness, but of course other materials can be used instead or in addition if desired. Each layer may be on the order of ½ Angstrom thickness, so it may take one hundred or more ALD cycles to deposit the dielectric (e.g., a $TiO_2$ layer of about 50 Angstroms). Also, the desired dielectric can also be doped so as to enhance its leakage or other properties, for example, with aluminum, yttrium, or another substance. In FIG. 3d, numeral 313 again represents the growth surface for the desired dielectric, and numeral 319 represents the selected deposition process, assumed to be ALD in this example. As represented by matching "lattice graphics" 321 in FIG. 3d, the BEL presents lattice matching properties with the desired dielectric form, so as to provide a repeatable process for ensuring the production of a metal oxide having a sufficiently high dielectric constant.

FIG. 3e provides a view of the completed structure; a MIM stack 301 is formed atop the substrate 303 and includes a BEL 305, a dielectric 311, and a top electrode ("TEL") 309; the TEL can be formed to have the same approximate thickness as the BEL, but need not have the same lattice properties since it is typically added after dielectric formation. Preferably, the TEL is a relatively high-work function material that if possible is also formed from a relatively inexpensive conductive material and has a thickness of 20-50 Angstroms or more. As with preceding FIGS., the growth surface for the dielectric and the lattice matching properties are respectively denoted by numerals 313 and 321.

With a MIM assembly now introduced, details on manufacturing processes and options will now be presented, with reference to FIG. 4-13.

II. Materials and Process Considerations

Figure 4:
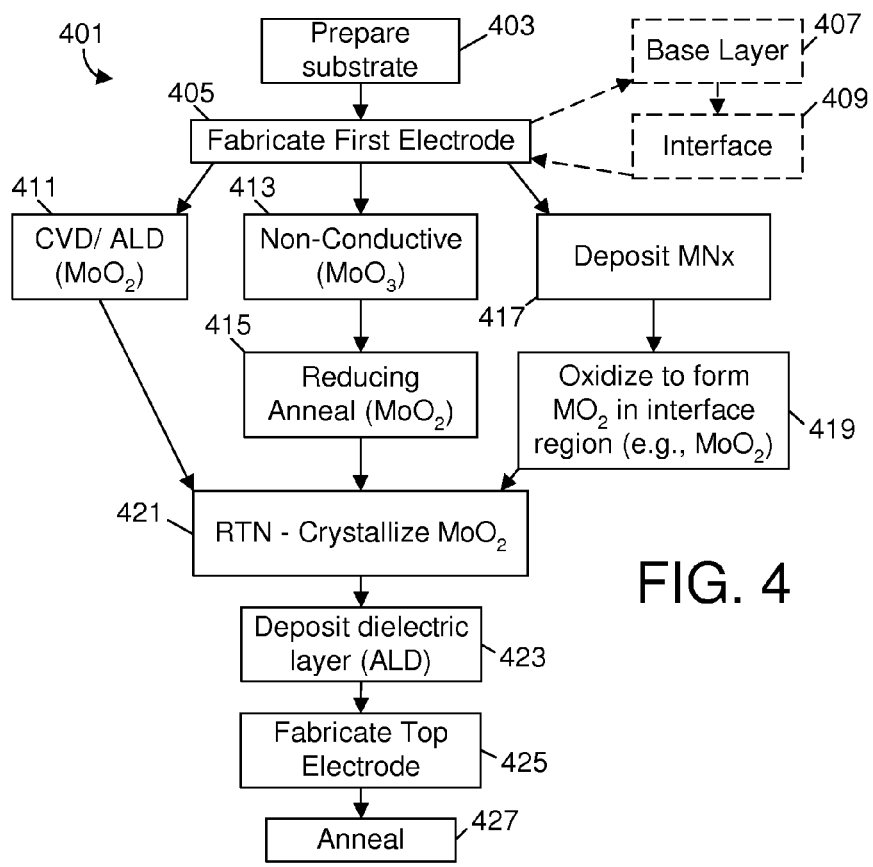

FIG. 4 shows methodology for fabricating a MIM assembly, including a number of process options. In particular, a general method is designated with numeral 401 with various options indicated in dashed lines, and a number of branches (represented by processes 411, 413 and 417) presenting fabrication alternatives. A silicon substrate is first prepared, as indicated by numeral 403. Preparation can consist of a cleaning process, such as for example using an ozone scrubbing process to remove any surface contaminants. The first electrode is then fabricated as the BEL, per numeral 405. As represented by dashed line optional processes 407 and 409, the BEL may be fabricated to have a base layer that is different from the material that provides the dielectric interface. As part of the electrode fabrication process, one of three basic alternate "branches" can be employed to fabricate the dielectric. First, as indicated by numeral 411, a CVD or ALD process can be used to deposit a conductor such as $MoO_2$;

again, there are alternatives to the use of this specific material and if it is desired to have rutile phase $TiO_2$ serve as the dielectric, other conductive materials (such as the conductive oxides listed earlier or meeting the lattice, energy and work function criteria mentioned earlier) may also be used. Second, as indicated by reference numeral 413, a non-conductive material may be deposited and used to in situ fabricate a suitable growth surface for the desired dielectric form. As indicated by numerals 413 and 415 together, $MoO_2$ may once again be obtained as a conductor by first depositing $MoO_3$ and then in situ processing the deposited material to convert it to become a conductor. The deposited $MoO_3$ may be subjected to a reducing anneal under controlled circumstances to remove just the "right amount" of oxygen, thereby converting nonconductive $MoO_3$ to conductive $MoO_2$. Third, one may also deposit a conductor such as a metal nitride and apply a conversion process to convert this material to provide a suitable growth surface, as represented by step 417. This option presents the advantage that metal nitrides are commonly used as conductors, and the process chemistry is well understood, and it also provides an effective "base layer" conductor for use as a bitline or other access element within a DRAM array. This option is separated from the second option mentioned above, because instead of a reducing anneal, an oxidation process is performed per block 419 to remove nitrogen atoms from an "interface layer" and to replace those nitrogen atoms with oxygen; once again in this example, a conductor of $MoO_2$ can be formed, this time upon a base layer of $Mo_2N$.

As with other materials, $MoO_2$ as a material does not necessarily inherently possess the crystalline structure suitable for dielectric growth but, rather, can be amorphous, especially, in as-deposited state. Thus, as indicated by process 421, the BEL once deposited is subjected to a RTN process to crystallize the interface layer as appropriate, to create a lattice structure matching that of the desired dielectric (or other material). With the growth surface thus readied, the dielectric and top electrode can be added, per processes 423 and 425, and the entire assembly can be subjected to an anneal, as indicated by numeral 427.

As mentioned, a number of different alternatives exist for fabrication the MIM layers as described above, including CVD and ALD, and including the use of materials other than $MoO_2$ and $MoO_3$. While it should be understood that these and other equivalent processes may be used, to facilitate a complete description of an entire fabrication process, ALD and associated options will be primarily discussed below.

A. One Exemplary Deposition Process: ALD

Atomic Layer Deposition, or "ALD," refers to a process used to deposit conformal layers with atomic scale thickness during semiconductor processing operations. ALD may be used to deposit barrier layers, adhesion layers, electrode layers, seed layers, dielectric layers, conductive layers, etc. ALD is generally regarded a multi-step, self-limiting process in the sense that a reaction terminates once a transferred material is consumed by the one or more reagents. Generally, a first material is first introduced into a processing chamber and adsorbed to a substrate. Excess material is then purged or pumped away, as appropriate, and then a second material is then introduced into the chamber, to react with the first material. Formation of a reacted film or monolayer using the aforementioned steps constitutes one deposition (or ALD cycle), and the process can then be repeated as necessary to form additional monolayers, with the number of cycles (and number of atomic layers) determining the film's total thickness. The ALD can be used to deposit each of the electrode and the dielectric, as well as the other stack layers referenced above.

Figure 5:
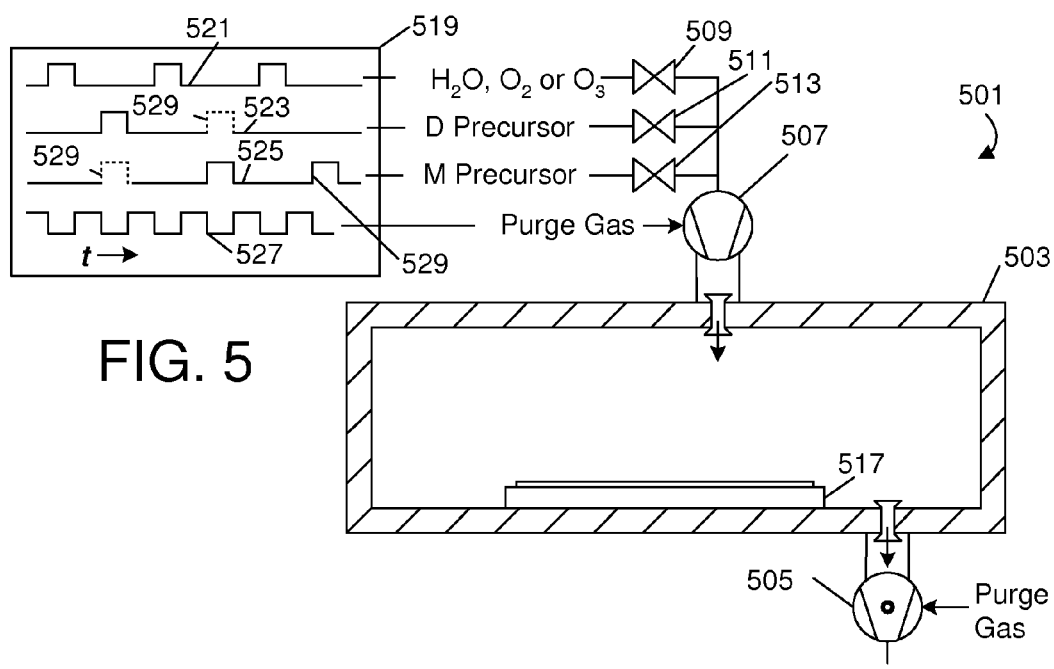
FIG. 5 shows an ALD chamber, which provides one mechanism for building a structure seen in FIG. 1 or FIG. 3e.

FIG. 5 presents a schematic 501 of an ALD chamber and an associated timing graph 519 that may be used to create oxide monolayers of titanium oxide, a dopant oxide or each of them. While discussed in the context of deposition of a dielectric, it should be understood that the same basic principles apply to fabrication of one or more layers of an electrode (e.g., an electrode having an interface layer of $WO_2$, $SnO_2$, $CrO_2$ or $MnO_2$). FIG. 5 shows a reaction chamber 503 having an evacuation pump 505 and an inlet 507, to introduce precursors and reagents into the chamber. Three valves, 509, 511 and 513 are depicted to each respectively supply a reagent (e.g., vaporized water, oxygen or ozone), a dopant precursor or a titanium precursor, as controlled by software. Each gas is selectively introduced into the chamber and forms a self-saturating layer as it flows over the substrate, which may be mounted on a suitable holder or pedestal 517 and, if desired, may be rotated or otherwise robotically manipulated during deposition or between cycles.

The timing diagram presented at the left-hand side of FIG. 5 shows relative timing pulses that may be used in one embodiment to fabricate oxide layers of titanium and a dopant (i.e., assuming it is desired to create a doped titanium oxide). In particular, a first waveform 521 represents the timing of reagent pulses, e.g., ozone ($O_3$), oxygen gas ($O_2$), vaporized water, or some other material, as mentioned above. Second and third waveforms, 523 and 525, respectively represent the operation of control valves 511 and 513 to supply primary metal (M) and dopant (D) precursors (e.g., as organometallics). Finally, a final waveform 527 represents a digital control over the purge gas functions, used to control both the injection and evacuation pumps (505 and 507). The process depicted in FIG. 5 may be used to introduce organometallics deposited together or sequentially without an intervening reagent and/or purge cycle. Solid lines 523 and 525 indicate the use of a sequential introduction of organometallics, for example, to deposit distinct layers of a primary metal (e.g., as a metal oxide) and a dopant (e.g., a dopant metal oxide, if desired) alternating between these materials to thereby build up an aggregated oxide (or other material) layer, e.g., via forty or more cycles; alternatively, as indicated by dashed line pulses 529, injection of organometallics into the deposition chamber may in some embodiments be simultaneous, so as to deposit a number of M-D-$O_x$ monolayers. Generally speaking, the use of a dopant is not strictly required, and depending on desired implementation, a layer may be fabricated using a primary metal oxide. Generally speaking, each monolayer in these embodiments can be expected to be on the order of about ½ Angstrom thick, such that forty layers would produce an oxide layer approximately two nanometers thick. Typical oxide layers can be expected to be at least this thick, with a conventional range being on the order of 4-12 nanometers thickness.

FIG. 5 illustrates that, if desired, a sequence of monolayers may be deposited by introducing a metal precursor, an oxygen source, a dopant precursor, an oxygen source, a metal precursor, an oxygen source, and so-on, in a repeating manner, to deposit $MO_X$ with occasional depositions of a dopant oxide, with intervening purge or other cycles as necessary. As alluded to earlier, dopants such as yttrium oxide, aluminum oxide, magnesium oxide or scandium oxide may also be employed, and the ALD process may also be used to deposit the electrode layers or their base materials as has been previously described.

Figure 6:
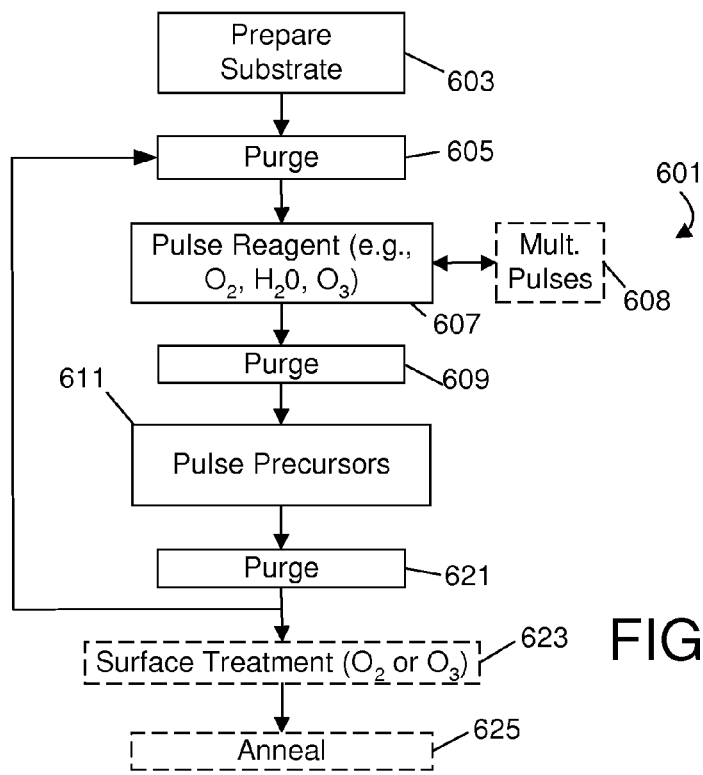
FIG. 6 shows a flowchart corresponding to the use of the chamber of FIG. 5. As indicated by dashed line processes, 623 and 625, a material if desired can first be deposited and then processed in situ to become suitable for use as an electrode, and then annealed.

FIG. 6 illustrates this general method, denoted by reference numeral 601. As indicated by block 603, a substrate may first be prepared and introduced into a clean room environment. The preparation steps may include any steps suitable to the substrate and other materials at issue, for example, as may be necessary to prepare for deposition of a first electrode on a substrate (e.g., via a wet or dry cleaning process). The substrate may include any material suitable for use in supporting a semiconductor layer, including metal, glass, some other insulator, or another material, conventional or otherwise; generally speaking, when fabricating a MIM stack for use as an electronic component (e.g., capacitor, DRAM cell), an electrode layer is first deposited or readied. For example, any of the processes mentioned earlier may be used to prepare an electrode surface for use as a suitable growth surface, with lattice matching properties. This surface may be crystallized via a RTP process, and if desired, "roughened" so as to increase effective capacitance. Once ready, the electrode surface may be cleaned or prepared. As mentioned, the preparation may also include a scrubbing step depending on exposed surface, to clean, oxidize and otherwise prepare the electrode surface.

Following preparation and pretreatment, the chamber is purged using a vacuum process, as indicated by function block 605. A reagent (such as oxygen gas, ozone gas, water vapor, or some other oxygen source) may then introduced to the chamber to adsorb to the surface of the substrate, per reference numeral 607; as alluded to above, the introduction of this reagent may overlap the scrubbing process, i.e., if ozone is used as the pretreatment agent and a vacuum is maintained, it may not be necessary to use further reagent for the first ALD cycle. Some designs may benefit from the use of multiple reagent pulses, separated if desired by a purge cycle. This process is indicated in FIG. 6 as a dashed-line (optional step) block 608. If necessary, the chamber is then again purged, to leave only a conformal amount of the reagent on the top surface of the substrate, as indicated by block 609. One or more precursors are then introduced to the chamber to react with the oxygen source (e.g., for an exposure time of from one to ten seconds), as indicated by block 611.

The cycle's result is a layer having a thickness on the order of a fraction of an Angstrom to a few Angstroms. Cycles may be then repeated as necessary to deposit any number of desired layers (e.g., forty times to produce a 2 nm thick dielectric layer for a hypothetical growth rate of 0.5 A/ALD cycle). When the dielectric layer of the appropriate thickness and metal electrode have been formed, the assembly can be subjected to an anneal process in an oxygen-rich environment, identified by reference numeral 623, which further oxidizes the fabricated film to fill remaining oxygen vacancies and reduce defects in the film, as will be described below.

Figure 7:
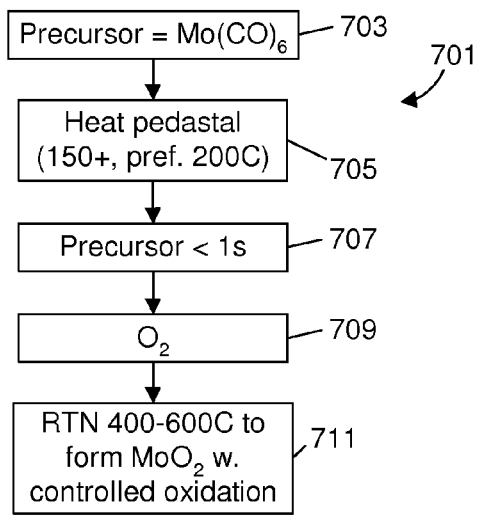
FIG. 7 shows a process for fabricating a layer molybdenum dioxide ($MoO_2$) using an ALD chamber. As indicated respectively by boxes 703 and 711, $Mo(CO)_6$ can be used as a precursor for this process, and an oxygenating anneal or other oxidation process may be used to crystallize $MoO_2$ to a form that will engender growth of rutile phase $TiO_2$.

FIG. 7 presents additional detail on a method 701 used to fabricate a conductor such as $MoO_2$ using an ALD process. In particular, a molybdenum precursor such as $Mo(CO)_6$ may be used as a metal precursor, using the ALD process just described. There exist a number of stable molybdenum forms, including $MoO_3$ (a thermodynamically favored state for molybdenum, also a nonconductive state), $MoO_2$, which is conductive and which in suitable crystalline form presents excellent lattice matching characteristics (for rutile phase $TiO_2$), and metal molybdenum (Mo). Thus, for the deposition process employed, it may be desired to use controlled process parameters to ensure that the desired material and state is produced. As indicated in FIG. 7 by numerals 705, 707, 709 and 711, for an ALD process using $Mo(CO)_6$, this can be achieved using a pedestal heated to at least 150 degrees Centigrade (C), preferably about 200 C, the use of relatively short precursor pulses (e.g., 1 to 10 second or less), oxygen, ozone or $H_2O$ gas as a oxidizing reagent, and a crystallization process (RTN at 400-700 C) to arrive at the $MoO_2$ having the desired crystalline form.

ALD or CVD can be used for deposition of these materials and can be accomplished by using variety of precursors, as set forth below.
1. Metal-organic precursors: Amides, acac-, carbonyls, Cyclopentadienyl based, Alkyl-Cyclopentadienyl, diketonates, Alkyl-amides and combination of two or more of the above.
2. Metal halides: Chlorides, fluorides and bromides.

B. Other Deposition Processes: PVD (Sputtering)

FIG. 8 provides a flow diagram 801 for a sputtering process. In this example, as before, it will be assumed that it is desired to produce crystalline $MoO_2$ as a desired growth medium for a material (such as rutile phase $TiO_2$). As mentioned, $MoO_3$ is the thermodynamically favored state for molybdenum and thus it is expected that a conventional reactive sputter process would result in the deposition of nonconductive $MoO_3$ in poisoned mode or metal molybdenum in metal mode. FIG. 8 therefore represents use of a closed-loop sputter process, that is, where target cathode voltage is measured and fed back to continuously regulate the sputter process parameters to a desired point of a hysteresis curve. As with many deposition processes, with PVD sputtering, a cathode voltage is used to accelerate ions toward a target, and the flow of the ions can be too little relative to the voltage such that deposition rate is too low and such that deposited materials do not have the desired chemical constituency, or too great so as to lower cathode voltage, thereby affecting deposition rate ("poison mode") and, once again, result in the desired chemical constituency not being deposited.

As indicated in FIG. 8, to determine process parameters, a number of test structures can be first fabricated at different pedestal temperatures, oxidizer flow rates and target voltages, with these process parameters held constant throughout the associated deposition instance. The obtained structures are evaluated for suitability, and a hysteresis curve is then plotted, to determine optimal process parameters. In this regard, an optimal process will be one that produces the desired material (e.g., $MoO_2$) with the maximum deposition rate. These processes are represented by numerals 803 and 805 in FIG. 8 and represent an offline process, denoted by the area vertically above a horizontal line 807. Once the optimal process parameters are determined, these parameters are then applied in run-time fab processes, denoted by the area below horizontal line 807. For example, these parameters may be applied in a closed-loop manufacturing run sputter process and used to fabricate working devices (e.g., capacitors or DRAMs), per numerals 809 and 811.

FIG. 9 provides further detail on the plotting of a hysteresis curve and selection of process parameters. FIG. 9 depicts a graph 901 that illustrates two different, superimposed hysteresis curves, respectively labeled 903 and 905. Notably, the second hysteresis curve 905 features an increasing slope (i.e., the opposite of the negative slope); the increasing slope indicates that cathode voltage for certain combinations of materials may actually increase (instead of decrease) for greater reactive gas concentrations, as oxides of certain materials may actually increase secondary electron production (relative to metal mode). The graph 901 identifies a metal mode region 907 and a poison mode region 909, with a mixed-mode region 911 there between, which is used to deposit a metal oxide; it is in this region, for example, that it would be desired to deposit $MoO_2$. In accordance with the teachings provided above, each hysteresis curve may be plotted in advance, via empirical determinations, and analyzed to determine how desired deposition influences desired electrical properties. For example, for the first curve 903, i.e., the one with the negative slope, different regions of tolerance may be established for desired electrical properties, as exemplified by hypothetical ranges 911 and 913 and point 915; the point 915 represents an optimal process, but one may also operate within ranges 911 and 913 to the extent these produce results within acceptable tolerances. With these ranges determined, a closed-loop sputtering process may be employed, with concentration of the reactive gas used to modulate cathode voltage to control the deposition to a specifically desired voltage (or voltages). A voltage profile may be developed, consisting of one or more desired voltages, changed if desired with respect to time. For example, such a profile can consist of a constant, single voltage used throughout the deposition process, or it may include one or more transitions between different voltage points during a continuous deposition process. Similarly, for the second curve 905, i.e., the curve having the positive slope, different hypothetical regions of tolerance can also be established, as represented by numerals 917 and 919 and point 921. For example, numeral 917 and the associated portion of the curve it designates, as represented by a curved arrow in FIG. 9, refer to a range of tolerance around a desired electrical property where adherence to the desired voltage need only be "good" and thus that can potentially accommodate higher depositions rates. Notably, inverting polarity of the slope implies inversion in the dependence of reactive gas pressure upon cathode voltage, i.e., when using different materials, it generally is desired to (a) compute a hysteresis curve appropriate to the machine being used and the deposition materials and (b) adjust control parameters, so that voltage deviation applies an impetus having the strength and polarity needed to properly control reactive gas pressure.

As mentioned above, both ALD and CVD present well established processes, and the use of sputtering as a PVD process is illustrated here merely to illustrate that different options exist for creating the structures discussed herein.

C. Other Materials or Process Considerations

As mentioned earlier, a number of other options also exist for fabricating the structures discussed herein. FIGS. 10-13 are used to illustrate these other materials and process considerations.

More particularly, FIG. 10 illustrates the second branch alluded to earlier, and provides an example where a nonconductive, thermodynamically favored form may be deposited and then processed in situ to provide the desired growth medium. Generally depicted by numeral 1001, the method may use a CVD, PVD or ALD process to deposit a material such as $MoO_3$ atop a substrate (or atop one or more base layers if desired). Once this process is complete, or in a contemporaneous manner, this material may then be partially or fully reduced to form $MoO_2$, as represented by numerals 1003 and 1005. As indicated, the reducing anneal may be performed within a window of 400-600 C under forming gas ($Ar/H_2$) environment. For $MoO_2$, and specific equipment and processes used for evaluation of this material, the data for appropriate anneal process parameters is given in Table 5, below. As indicated in Table 5, for the experiments run, it was found preferable to use an anneal temperature closer to 600 C for a period of 3-10 minutes.

TABLE 5

| Phase | 3 min | 10 min | 15 min |
|---|---|---|---|
| 450C | Amorphous | $MoO_3$ + $Mo_4O_{11}$ + $MoO_2$ | $MoO_3$ + $Mo_4O_{11}$ + $MoO_2$ |
| 600C | $MoO_2$ | $MoO_2$ | $MoO_2$ + Mo |
| 700C | Mo + $MoO_2$ | Mo + $MoO_2$ | Mo |

It is also believed that reduction can also be achieved in an anneal or depositing environment where a very low oxygen partial pressure is provided, for example, by relying on $H_2/H_2O$ or $CO/CO_2$ gas mixtures (e.g., using a vacuum and/or forming gas environment).

General electrical data for the processes and structures set forth above, showing improvements obtained using $MoO_2$ as an interface layer with aluminum doped $TiO_2$ and a TiN base layer, are set forth in Table 6, below.

TABLE 6

| Structure | RTN (C) | Thickness (nm) | EOT (nm) | K |
|---|---|---|---|---|
| TiN/Al—$TiO_2$/ | 460C | 12 | 1.37 | 34 |
| TiN/$MoO_2$/Al—$TiO_2$/ | 460C | 12 | 0.67 | 69 |
| TiN/$MnO_2$/Al—$TiO_2$/ | 460C | 12 | 0.66 | 71 |

The process depicted by FIGS. 4 and 10 may be attractive for a variety of reasons. As transition metals may have several oxidation states, a metal oxide with a lattice structure compatible with rutile phase $TiO_2$ may not be the easiest material to fabricate due to governing thermodynamics. For example, the processing space for $MoO_2$ deposition is narrow when compared to process space for $MoO_3$ which, as mentioned is thermodynamically favored.

$MoO_2$ is not the only material that can be produced using the methods of FIG. 4 (second branch) or FIG. 10; a number of other suitable materials exist, including the oxides mentioned earlier (at least molybdenum dioxide, tungsten dioxide, chromium dioxide, manganese dioxide, tin dioxide or). To provide an example relating to manganese, with reference to FIG. 11, Mn, $Mn_2O_3$ and $Mn_3O_4$ are relatively stable states with broad process windows. In order to obtain $MnO_2$, desired for capacitor applications based on lattice matching characteristics with $TiO_2$, $Mn_2O_3$ or $Mn_3O_4$ can first be deposited using a CVD or ALD process and then oxidized to $MnO_2$, as generally indicated by method 1101 Here again, oxidation can be accomplished by anneal in oxygen or any oxygen bearing environment such as ozone or water. Experiments were performed to demonstrate that ozone anneal can result in oxidation of $Mn_2O_3$ to $MnO_2$; these experiments were also run using oxygen gas ($O_2$) but without adequate results. Using much the same process, $WO_3$ can be reduced to $WO_2$, and it is believed this approach can be applied for the other "difficult to produce" oxides indicated above, for use as an interface layer. Once the suitable interface material has been formed, an anneal process is then once again applied to produce the desired crystalline form. Generally speaking, the deposition, oxidation and crystallization steps are represented in FIG. 11 by numerals 1103, 1105 and 1107.

FIG. 12 presents another method 1201 used to form a desired interface layer, again using the example of $MoO_2$. For example, per step 1203, CVD or an ALD process may be used to deposit a metal nitride such as $Mo_2N$ to form a general conductor. As represented by process step 1205, this material can then be subjected to an oxidizing anneal (again with controlled process parameters) to replace nitrogen atoms (in principle, reducing the nitrogen) with oxygen atoms to form $MoO_2$. As with the processes described previously, after the appropriate metal oxide has been formed, the resultant layer can then be subjected to an RTN process (per numeral 1207) to appropriately crystallize the conductor surface. Again, while an anneal temperature window of 400-600 C may be generally used for this purpose, it has been found that a 600 degree anneal for approximately 3-10 minutes produces appropriate results.

The use of a conversion process described in FIG. 12 presents several advantages. First, metal nitrides have significantly lower resistivity as compared to metal dioxides. Having a bulk of electrode in metal nitride form with metal dioxide layer on top would meet all requirements for an electrode fabrication (low resistivity due to metal nitride, high work function and rutile-like surface to the "converted" metal dioxide (i.e., the interface layer). Second, such a process wouldn't require any special requirements to form the metal oxide material used for the interface—a MNx/metal oxide stack electrode can be formed by CVD/ALD deposition of the metal nitride, followed by oxidation treatment of the nitride so as to form a thin metal oxide layer on the top. The temperature and oxygen partial pressure of the anneal environment can be controlled to form the specifically desired oxide such that further reduction or oxidation is not needed.

The processing windows associated with this processing, and with the other processes described above for molybdenum, are further illustrated in FIG. 13. FIG. 13 shows a graph 1301 having two curves, 1303 and 1305, which respectively indicate process boundaries associated with the use of $MoO_2$; in particular, dashed-line curve 1303 represents process boundaries between the formation of $MoO_3$ and $MoO_2$, and curve 1305 represents process boundaries between the formation of $MoO_2$ and metal molybdenum (Mo). As indicated by FIG. 13, appropriate selection of process temperature and oxygen rate, when combined with appropriate process materials, may be used to fabricate a desired class of electrode materials based on a metal oxide, for example, based on molybdenum dioxide ($MoO_2$), tungsten dioxide ($WO_2$), chromium dioxide ($CrO_2$), manganese dioxide ($MnO_2$) or tin dioxide ($SnO_2$). Generally speaking, through appropriate control of processing parameters, including process temperature and materials supply, an oxide having the desired properties may be formed, in lieu of a different oxidation state that perhaps might otherwise be thermodynamically favored. Once formed, the deposited material may then be crystallized as appropriate (using an anneal process) and the stack or assembly may thereafter serve as the host for a dielectric fabrication process, and the subsequent addition of a top electrode or other layers as has been previously introduced.

D. Roughening to Increase Effective Dielectric Constant

Another process variation used to improve device properties is the roughening of an electrode/dielectric interface to increase effective capacitor area. In particular, for a capacitor of given width, length and plate separation, effective capacitance can be increased by increasing capacitor plate surface area; by increasing surface roughness of one or both of the capacitor plates, which effectively increases the surface area of the electrode, additional effective dielectric constant of a resultant semiconductor stack can be obtained. U.S. Pat. No. 6,794,245 to Zheng was referenced earlier as relating to a hemispherical silicon process. In the context of the current embodiments, however, one way electrode surface roughness can be increased is through the use of an ozone scrubbing or pretreatment process applied to scratch the surface of an electrode or the dielectric, that is, to create roughness on a microscopic scale as opposed to a hemispherical silicon process. This roughness can be created either subsequent to BEL formation but prior to dielectric fabrication, or subsequent to dielectric formation but prior to TEL formation.

For some experiments run in the context of PCT/US09/57371, it was found that the rougher the electrode surface, the higher the effective dielectric constant and the higher the leakage. For some designs, it may be desired to maximize dielectric constant up until a point where leakage reaches a level that is unacceptable. Below this roughness level (RMS median roughness of about 3.0 nanometers), it was found that dielectric constant can be maximized for a given set of materials without violating maximum leakage requirements of $10^{-6}$ Amps per square centimeter, at 1 Volt, with a preferred range of 1.5 to 3.0 nanometer RMS roughness. Clearly, a different median roughness can be used to maximize effective dielectric constant depending upon specification constraints for leakage. As to the duration and concentration of an agent used for the pretreatment process, it is believed that a source of approximately 10% ozone to oxygen ratio can be used, with an exposure time selected on the order of one to hundreds of seconds, depending on the electrode materials. The specific exposure variables should be selected based on the materials used and other design constraints (such as maximum desired leakage), with the goal being to scratch or displace only some of the exposed electrode or dielectric surface in order to increase its effective surface area. While a scrubbing process that utilizes ozone to remove this material has been described above, it is believed that many processes may be equivalently suited to this process if they increase the RMS variation of the electrode surface in the manner indicated that increases electrode or dielectric surface area without significantly affecting the ability of that surface to mechanically and electrically interface with the dielectric layer.

The processes discussed above present an effective way to increase effective dielectric constant for given capacitor design, and should present an attractive alternative to using other processes, such as those that rely upon hemispherical polysilicon.

With both basic MIM assemblies and associated process materials and considerations thus presented, attention will now be directed to forming devices and structures based on these materials, including DRAM cells and associated arrays.

III. Fabrication of a Dram Cell and Associated Memory Array

As mentioned above, two specific applications of the principles discussed herein are to the fabrication of capacitors and to the fabrication of memory cells, including dynamic random access memory ("DRAM") cells (which form the basis for volatile memory in most contemporary computer systems). FIGS. 14 and 15 will be used for this initial discussion. DRAM memory cells use a capacitor to store charge for a period of time, with the charge being electronically "read" to determine whether a logical "one" or "zero" has been stored in the associated cell. Conventionally, a cell transistor is used to access the cell, i.e., the cell transistor is turned "on" in order to store data on each associated capacitor and is otherwise turned "off" to isolate the capacitor and preserve its charge. More complex DRAM cell structures exist, but this basic DRAM structure will be introduced below, for purposes of illustrating the application of the principles of this disclosure to capacitor manufacturing and to DRAM manufacturing. Following this introduction, several specific structures will be described, with reference to FIGS. 16-18.

FIG. 14 is used to illustrate one DRAM cell 1401, namely, one built using a dielectric layer 1403. The cell 1401 is depicted to schematically include two principal components, including a cell capacitor 1405 and the cell transistor 1407 (seen at the left-hand side of FIG. 14). The cell transistor is usually constituted by a MOS transistor having gate 1409, source 1411 and drain 1413, the gate 1409 being connected to a word line ("WL") and one of the source 1411 and drain 1413, being connected to a bit line ("BL"); in this example, it is the source 1411 that is depicted as coupled to the bitline. The cell capacitor has a lower or storage electrode 1415 and an upper or plate electrode 1417; in this example, the storage electrode is connected to the other end of the cell transistor (i.e., to the drain 1413 in this example), such that the cell transistor acts as a switch for storing and destructively reading charge from the storage electrode and the plate electrode is coupled to a reference potential 1419 (e.g., ground). When selected for reading or writing, the cell transistor is turned "on" by an active level of the word line "WL" to access the storage electrode of the cell capacitor 1405 via the bit line "BL." The memory cell according to each of embodiments described below includes each of these basic elements, including a cell capacitor 1407, configured to have an insulating layer (e.g., a dielectric layer) 1403 sandwiched between two metal electrodes (e.g., storage and plate electrodes, 1415 and 1417).

As was introduced earlier, the cell capacitor 1407 is fabricated by initially depositing a bottom electrode (e.g., storage electrode 1415) upon a substrate 1421 using one of many well-known processes. This electrode includes a layer of material 1423 that provides an interface area suitable for the growth of a particular metal oxide form, rutile phase $TiO_2$ per many of the examples discussed above, to provide desired dielectric constant in the dielectric layer 1403. That is to say, the dielectric layer 1403 formed between the conductors is enhanced through lattice matching through the use of layer of material 1423. As mentioned earlier, the material used for this layer can be made to have a primary constituent selected from the group of molybdenum dioxide ($MoO_2$), tungsten dioxide ($WO_2$), chromium dioxide ($CrO_2$), manganese dioxide ($MnO_2$) or tin dioxide ($SnO_2$) and processed as necessary to have a desired lattice structure, with advantages presented by generally low-cost of materials and fabrication, and compatibility with existing semiconductor manufacturing processes, i.e., it can be easily implemented and scaled. The layer 1423 can be made itself the entire electrode (e.g., the storage electrode 1415 consists entirely of layer of material 1423) or the storage electrode can have an inexpensive layer of base material 1425 that is in some embodiments conductive (e.g., fabricated from $Mo_2N$ or a similar base metal). Furthermore, if desired, the layer 1423 may have a top surface which is roughened as indicated by arrow 1427, so as to increase effective dielectric constant by effectively increasing capacitor plate area without increasing overall capacitor dimensions. Irrespective of specific process, the storage electrode 1415 and especially layer 1423 is used to selectively store charge to represent a logic state, i.e., it is normally electrically isolated from other components and is accessed using the cell transistor 1405. The dielectric layer 1403 helps maintain an electric field between this plate and the second conducting layer or plate electrode 1417, which may be connected to ground. As with the case with each of the embodiments herein, depictions are drawn to explain principles only, and should not be understood to denote relative sizes.

The cell transistor 1407 receives two inputs, respectively representing column and row selection lines used to access a matrix of DRAM cells (not shown in FIG. 14). In particular, activation of a column select signal via wordline "WL" causes the transistor to conduct, and to electrically couple the bitline "BL" with a drain terminal 1413 of the cell transistor, to connect the row selection line to the storage electrode 1415 of the cell capacitor. As is known, the bitline "BL" may be coupled to this conducting layer either to provide charge for storage purposes, or to "sense" the stored value of the capacitor. As is typical with DRAM devices, the cell capacitor retains charge only for a short amount of time and refresh procedures may be used if it is desired to retain charge for any significant period.

DRAM technology is relatively cheap to manufacture and usually allows a significant density to be achieved, which are primary reasons why DRAM technology is so commonly used in contemporaneous computer and other digital systems. By enabling a greater dielectric constant to be achieved, and thinner dielectric layers to be used, the principles provided by this disclosure facilitate even smaller and cheaper memory cells.

FIG. 15 illustrates a memory array 1501 formed of DRAM cells, where each cell may be (for example) identical to the cell 1401 presented in FIG. 14. While only four such cells 1511 are illustrated in FIG. 15, it should be understood that a great many cells would typically be presented on a memory device, e.g., millions. Each memory cell 1511 is accessed by a particular combination of row selection line (1503 or 1505) with column selection line (1507 and 1509); while only four address lines have been presented in FIG. 15, a great many more will typically be presented (e.g., 64 columns for memory devices that utilize a 64-bit wide parallel data bus, and a much larger number of row selection lines).

FIGS. 16-18 respectively illustrate memory cells 1601, 1701 and 1801, each illustrating different capacitor configurations. Each memory cell 1601, 1701 and 1801 is formed on a semiconductor substrate 1605, 1705 or 1805, for example, a silicon substrate. Above this substrate, a source or drain region of a cell transistor (1611, 1711 or 1811) is selectively formed. It should be noted that the gate and the other of the source and drain of the cell transistor are omitted in order to avoid the complexity of the drawings. It should be further noted that other memory cells and word and bit lines as well as memory control circuits are also not shown for the same purpose. Each cell capacitor 1621, 1721 or 1821 is formed over the substrate and is connected to the cell transistor region 1607, 1707 or 1807 through a contact plug (1619, 1719 or 1819), formed selectively in an interlayer insulating film 1617, 1717 or 1817 on the substrate. The contact plug may be made of poly-silicon and/or metal such as Tungsten, and the interlayer insulating film may be made of silicon oxide. Each capacitor 1621, 1721 or 1821 is further connected to reference potential wiring 1631, 1731 or 1831. The cell transistor of each of the memory cells is generally the same for FIGS. 16-18 and may be constituted by any one of a planer type, a recess type, a pillar type, a fin type and any other types. However, the configuration of the storage capacitors is different for each of these FIGS.; the memory cell of FIG. 16 includes a cylinder-shaped capacitor 1621, while the memory cells of FIGS. 17-18 are respectively depicted to include a pillar-shaped capacitor 1721 and a crown-shaped capacitor 1821.

FIG. 16 illustrates a memory cell 1601 having a cylinder-shaped capacitor 1621. The capacitor 1621 has cylindrical electrodes 1623 and 1627 surrounding a dielectric layer 1625. The electrodes 1623 and 1627 and dielectric layer 1625 may be formed of the materials described herein using the processes described herein.

As an example of a general process for forming a cylinder-shaped capacitor, an etching stopper film 1622 such as silicon nitride is formed on the interlayer insulating film 1617, followed by another insulating film 1624 such as silicon oxide. The film 1624 is used to determine the height of the cell capacitor 1601. Selective etching is performed on the insulating film 1624 and the stopper film 1622 to form a cylinder hole. The upper surface of the contact plug 1619 is thereby exposed. A conductive layer is then deposited inside of the cylinder hole and on the upper surface of the contact plug 1619, followed by further selective etching, such that the lower or storage electrode 1623 is formed. The electrode may have a surface consisting of an exposed ruthenium-based material as has previously been discussed, and a pretreatment process may then be utilized so as to increase effective capacitive plate area. The dielectric layer 1625 is formed on the storage electrode 1623 and the upper surface of the insulating film 1624. The upper or plate electrode 1627 and the wiring 1631 are thereafter formed to complete the cylinder type cell capacitor. If desired, additional roughening processes can be utilized for the interface between the dielectric layer and the upper electrode, though this is not required.

FIG. 17 illustrates a memory cell 1701 using a pillar- or pedestal-shaped capacitor 1721. The capacitor 1721 includes a pillar-shaped bottom electrode 1723, a dielectric layer 1725, and a top electrode 1727. The dielectric layer 1725 and top or plate electrode 1727 are deposited to conform with the pillar-shaped bottom electrode 1723. As with the capacitor 1621 from FIG. 16, the electrodes 1723 and 1727, and the dielectric layer 1725 may be formed of the materials and/or the processes described herein.

As an example of a general process for forming a pillar-shaped capacitor, a metal pad 1726 such as tungsten is selectively formed to cover the upper surface of the contact plug 1719, followed by an insulating layer (not shown) deposited over the entire surface. Thereafter, a capacitor hole for each memory cell is formed in the insulating layer by selective etching, and a conductive layer is then deposited over the insulating layer to fill each capacitor hole. The CMP (Chemical Mechanical Polishing) method is then performed on the conductive layer thus deposited, so that the pillar electrode 1723 for each memory cell is formed. Here also, the ruthenium and pretreatment processes may be employed as has been previously introduced. After removing the insulating layer, a dielectric layer 1725 is formed on each pillar electrode 1723 and the insulating film 1717, followed by the upper electrode 1727 and the wiring 1731. The pillar type cell capacitor is thus formed.

FIG. 18 illustrates a memory cell 1801 using a crown-shaped capacitor 1821. The capacitor 1821 includes a crown-shaped bottom electrode 1823, a dielectric layer 1825, and a top electrode 1827. The dielectric layer 1825 and the top electrode 1827 conform to the crown shape of the bottom electrode 1823. As with the capacitor 1621 from FIG. 16, the electrodes 1823 and 1827 and the dielectric layer 1825 may be formed of the materials and/or the processes described herein.

The methodology for forming a crown-shaped capacitor may be similar to that depicted in FIG. 16, i.e., a lower or storage electrode for each memory cell can be first formed using etching stopper 1622 and an interlayer insulating film 1624 (see, e.g., FIG. 16). The insulating film is then, however, removed. As depicted in FIG. 18, a dielectric layer 1825 can then be deposited above the lower or storage electrode 1823, to form the crown shape. The upper or plate electrode 1827 and the wiring 1831 are then formed to complete the formation of the crown-shaped cell capacitor.

Although cylinder-, pillar-, and crown-shaped storage capacitors are described above, it is understood that these descriptions are given only as examples, and that the materials and processes described herein can be used to form any style of type of memory storage device.

IV. Conclusion

What has been described are methods of fabricating a semiconductor assembly that can be used as part of a capacitive device, memory device or similar structure. Specific materials have been presented for use as a dielectric, enabling smaller and more efficient capacitors, memory devices and other structures to be constructed, characterized by high dielectric constant and excellent leakage characteristics. While not limited to the use of these materials, specific manufacturing processes have also been presented, including the use of processes that facilitate the growth of specific metal oxide forms for use as a dielectric, e.g., the growth of rutile phase $TiO_2$, leading to improved device characteristics. Other applications will readily occur to those having skill in the art in view of the teachings provided above, or in view of the invention defined by the claims set forth below.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

The invention claimed is:

1. A method of fabricating a semiconductor layer stack, comprising:
    forming a layer consisting primarily of a conductive metal oxide selected from the group of molybdenum dioxide (MoO2), tungsten dioxide (WO2), chromium dioxide (CrO2), manganese dioxide (MnO2), iron dioxide (FeO2), tin dioxide (SnO2), cobalt dioxide (CoO2) and nickel dioxide (NiO2); and
    forming a metal oxide-based dielectric in contact with the layer, the metal oxide consisting primarily of rutile-phase titanium dioxide (TiO2).

2. The method of claim 1, where the layer is an interface layer, the method further comprising forming an electrode, the electrode including the interface layer and a base layer.

3. The method of claim 2, where forming the electrode includes forming the base layer to consist primarily of a conductive material selected from the group of molybdenum nitride, tungsten nitride, titanium nitride, chromium nitride or cobalt nitride.

4. The method of claim 2, where forming the electrode includes forming the interface layer to include a metal oxide with a thermodynamically-favored oxide state that is substantially non-conductive, the forming including using a temperature-controlled process to set the metal oxide in a conductive state, and where forming the metal-oxide based dielectric includes forming a layer of rutile-phase titanium dioxide (TiO2) in direct contact with the interface layer.

5. The method of claim 2, where forming the electrode includes forming the interface layer to consist primarily of the conductive metal oxide.

6. The method of claim 2, where the interface layer has a thickness of no more than 5 nanometers.

7. The method of claim 1, where the conductive metal oxide is molybdenum dioxide ($MoO_2$).

8. The method of claim 1, where forming the layer includes forming an electrode and annealing the electrode prior to forming the dielectric.

9. The method of claim 8, where: forming the layer includes depositing a metal oxide in a substantially non-conductive state; and annealing includes post deposition annealing the metal oxide in an oxygen-reducing ambient at a temperature of at least 600 degrees centigrade to remove oxygen atoms and to increase conductivity of the metal oxide.

10. The method of claim 1, where forming the layer includes depositing a conductive material and surface treating the conductive material prior to depositing the dielectric to form the layer as a region of the conductive material modified by the surface treating.

11. The method of claim 10, where surface treating the conductive material includes oxygenating the conductive material to create the conductive metal oxide.

12. The method of claim 11, where the conductive material is selected from the group of molybdenum nitride and tungsten nitride, and where the metal oxide is selected from the group of an oxide of molybdenum and tungsten.

13. The method of claim 1, where forming the layer includes forming the layer to have a thickness of no more than approximately 20 nanometers, and where forming the dielectric includes forming the dielectric to have a thickness of no more than 15 nanometers.

14. The method of claim 1, where forming the layer includes depositing a substantially non-conductive material and chemically modifying an exposed portion of the material to increase conductivity to thereby form the layer from the exposed portion.

15. A method, comprising:
   forming an electrode, the electrode having at least a layer having a compound with (a) a work function of at least 4.8 Electron Volts, (b) a Gibbs free energy of at most −400 kiloJoules per mole and (c) a lattice structure substantially compatible with rutile-phase titanium dioxide ($TiO2$); and
   forming a dielectric layer including titanium dioxide ($TiO2$) in contact with the interface layer.

16. The method of claim 15, where forming the electrode includes forming the layer to have a primary lattice structure with lattice constants each within ten percent of lattice constants for rutile-phase titanium dioxide ($TiO2$).

17. The method of claim 15, where forming the electrode includes forming the layer to have a primary lattice structure with lattice constants each within five percent of lattice constants for rutile-phase titanium dioxide ($TiO2$).

18. The method of claim 15, where forming the electrode includes forming the layer with the compound selected from the group of molybdenum dioxide ($MoO2$), tungsten dioxide ($WO2$), chromium dioxide ($CrO2$), manganese dioxide ($MnO2$), iron dioxide ($FeO2$), tin dioxide ($SnO2$), cobalt dioxide ($CoO2$) and nickel dioxide ($NiO2$).

19. The method of claim 15, where forming includes initially depositing a material that is substantially non-conductive, and modifying the material in-situ to form the layer as a conductive metal oxide.

20. The method of claim 15, where forming includes using a closed-loop sputter deposition process using voltage feedback to form the layer in a conductive state.

21. The method of claim 15, where forming includes using an atomic layer deposition process.

22. The method of claim 21, where using the atomic layer deposition process includes reacting a nitrogen-containing metal precursor with a source of oxygen and heating a pedestal.

23. The method of claim 15, where depositing includes using a chemical vapor deposition process.

24. The method of claim 15, where the layer is an interface layer and where forming an electrode includes forming at least two discrete layers, one of which is the interface layer, each of the at least two discrete layers primarily composed of different materials.

25. A method, comprising:
   forming an electrode layer having a metal oxide with thermodynamically-favored oxide state that is substantially non-conductive, the forming including using a temperature-controlled process to set the metal oxide in a conductive state; and
   forming a dielectric including an oxide of titanium ($TiOx$) in contact with the electrode surface.

26. The method of claim 25, where the metal oxide is molybdenum trioxide and the temperature-controller process converts the molybdenum trioxide ($MoO3$) to molybdenum dioxide ($MoO2$).

* * * * *